United States Patent
Yun et al.

(10) Patent No.: US 8,203,653 B2
(45) Date of Patent: *Jun. 19, 2012

(54) INTEGRATED ANALOG VIDEO RECEIVER

(75) Inventors: Weijie Yun, San Jose, CA (US); Samuel Sheng, Los Gatos, CA (US); Dennis G. Yee, San Francisco, CA (US)

(73) Assignee: Telegent Systems, Inc., Grand Cayman (KY)

( * ) Notice: Subject to any disclaimer, the term of this patent is extended or adjusted under 35 U.S.C. 154(b) by 594 days.

This patent is subject to a terminal disclaimer.

(21) Appl. No.: 12/191,905

(22) Filed: Aug. 14, 2008

(65) Prior Publication Data

US 2008/0297664 A1    Dec. 4, 2008

Related U.S. Application Data

(62) Division of application No. 11/120,571, filed on May 2, 2005, now Pat. No. 7,453,526.

(60) Provisional application No. 60/567,191, filed on Apr. 30, 2004, provisional application No. 60/612,108, filed on Sep. 21, 2004, provisional application No. 60/612,282, filed on Sep. 21, 2004, provisional application No. 60/623,193, filed on Oct. 29, 2004, provisional application No. 60/634,468, filed on Dec. 9, 2004.

(51) Int. Cl.
  *H04N 5/44* (2011.01)
(52) U.S. Cl. ....................... 348/725; 348/726
(58) Field of Classification Search .................. 348/725, 348/731, 726, 727, 663, 670, 645, 655; 455/196.1, 455/264, 324, 303, 304, 255, 256, 257; 329/306
  See application file for complete search history.

(56) References Cited

U.S. PATENT DOCUMENTS

| | | |
|---|---|---|
| 4,402,005 A | 8/1983 | Lewis |
| 4,413,274 A | 11/1983 | Hosoya |
| 4,694,326 A | 9/1987 | Demmer |
| 5,027,371 A | 6/1991 | Sehier et al. |
| 5,140,699 A | 8/1992 | Kozak |
| 5,428,400 A | 6/1995 | Landis et al. |
| 5,671,019 A | 9/1997 | Isoe et al. |
| 5,703,662 A | 12/1997 | Yoon |
| 5,724,653 A | 3/1998 | Baker et al. |
| 5,986,720 A | 11/1999 | Kishigami et al. |

(Continued)

FOREIGN PATENT DOCUMENTS

CN    1264517 A    8/2000

(Continued)

OTHER PUBLICATIONS

In Re Chinese Application No. 200580020867.2, Office Action issued May 8, 2009 by the State Intellectual Property Office of the P.R.C., eighteen (18) pages total including eleven (11) pages of English-lanaguage translation.

(Continued)

*Primary Examiner* — Michael Lee
(74) *Attorney, Agent, or Firm* — Richard T. Ogawa; Ogawa P.C.

(57) ABSTRACT

An analog video receiver implemented in an integrated circuit device. The analog video receiver includes an amplifier to amplify an analog video signal having a desired carrier frequency, and a mixing circuit to mix the amplified analog video signal with a complex sinusoid having a frequency substantially equal to the carrier frequency.

36 Claims, 5 Drawing Sheets

U.S. PATENT DOCUMENTS

| | | | |
|---|---|---|---|
| 6,175,269 B1 | 1/2001 | Gielis et al. | |
| 6,192,225 B1 | 2/2001 | Arpaia et al. | |
| 6,460,180 B1 | 10/2002 | Park et al. | |
| 6,473,460 B1 | 10/2002 | Topper | |
| 6,510,313 B1 | 1/2003 | Rapeli | |
| 6,522,223 B1 | 2/2003 | Lobl et al. | |
| 6,687,313 B1 | 2/2004 | Limberg | |
| 6,757,028 B2 | 6/2004 | Yamamoto | |
| 6,968,020 B1 * | 11/2005 | Jayaraman | 375/327 |
| 7,327,404 B2 | 2/2008 | Chen et al. | |
| 2001/0033660 A1 | 10/2001 | Maeda | |
| 2002/0158990 A1 | 10/2002 | Kishi | |
| 2003/0026590 A1 | 2/2003 | Todo et al. | |
| 2003/0035470 A1 | 2/2003 | Gu | |
| 2004/0082300 A1 | 4/2004 | Scheck | |
| 2004/0165113 A1 | 8/2004 | Kim et al. | |
| 2005/0243217 A1 | 11/2005 | Yun et al. | |
| 2005/0243218 A1 | 11/2005 | Yee et al. | |
| 2005/0243219 A1 | 11/2005 | Yun et al. | |
| 2005/0243220 A1 | 11/2005 | Yun et al. | |
| 2006/0017856 A1 | 1/2006 | Sheng et al. | |

FOREIGN PATENT DOCUMENTS

| | | |
|---|---|---|
| JP | 62206967 A | 9/1987 |
| WO | WO96/08849 | 3/1996 |
| WO | WO96/17445 | 6/1996 |
| WO | WO97/14158 | 4/1997 |
| WO | WO 9843357 A1 | 1/1998 |
| WO | WO98/10523 | 3/1998 |
| WO | WO 9838799 A1 | 3/1998 |
| WO | WO98/38799 | 9/1998 |
| WO | WO98/43357 | 10/1998 |
| WO | WO00/72441 | 11/2000 |
| WO | WO01/19047 | 3/2001 |
| WO | WO01/47105 | 6/2001 |
| WO | WO02/03570 | 1/2002 |
| WO | WO02/39580 | 5/2002 |
| WO | WO02/43259 | 5/2002 |
| WO | WO2005/039055 | 4/2005 |

OTHER PUBLICATIONS

International Search Report of the International Searching Authority in International Application PCT/US05/015174 dated Jan. 25, 2006, 19 pages.

Preliminary Report on Patentability and Written Opinion of the International Searching Authority for PCT/US2005/015174, ISA European Patent Authority, issued Nov. 9, 2006, 12 pages.

European Patent Office, European Search Report, Application No. 09155818.9-1241/2075908, Jun. 22, 2009, 6 pages.

Chinese Patent Office, Office Action of May 4, 2010 in Chinese Patent Application No. 200910130301.5; 4 pages.

English Lanuage Translation of May 4, 2010 Office Action from Chinese Patent Office in Chinese Patent Application No. 200910130301.5, 7 pages.

Communication pursuant to Article 94(3) EPC of European Patent Office mailed on Feb. 22, 2011.

Office Action and List of References for U.S. Appl. No. 12/784,107 mailed Mar. 14, 2012 from the United States Patent and Trademark Office.

* cited by examiner

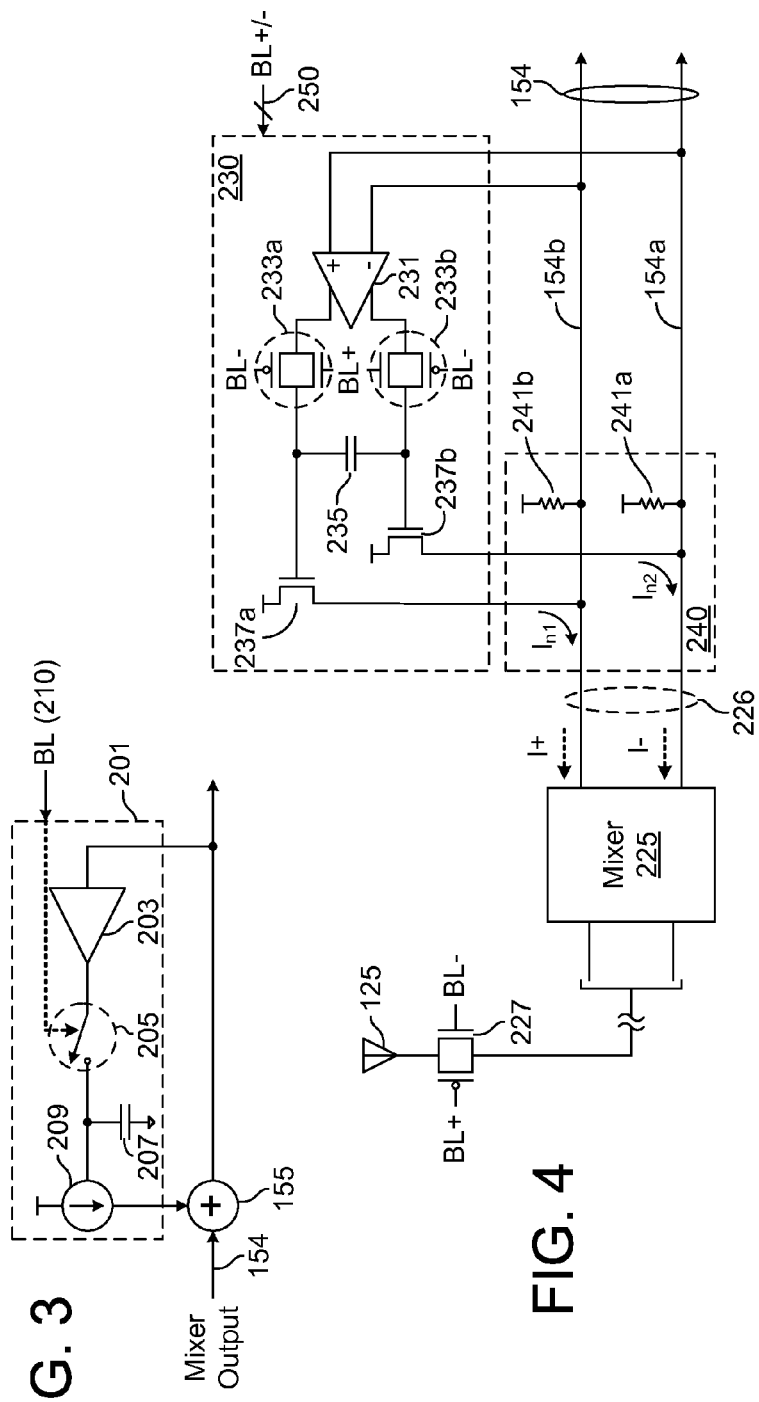

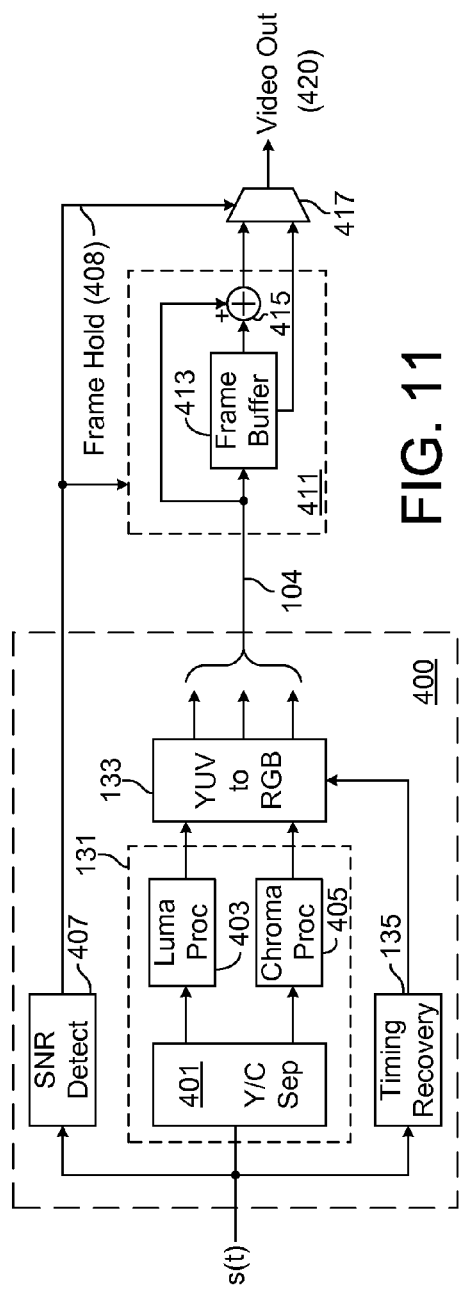
FIG. 11
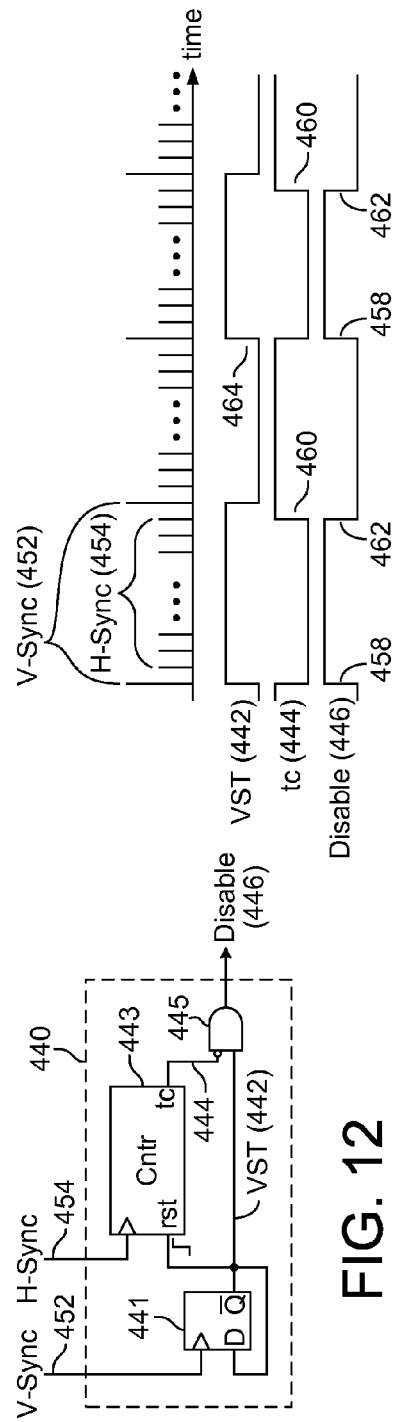
FIG. 13
FIG. 12

INTEGRATED ANALOG VIDEO RECEIVER

CROSS-REFERENCE TO RELATED APPLICATIONS

This application is a division of U.S. patent application Ser. No. 11/120,571 filed May 2, 2005 now U.S. Pat. No. 7,453, 526, entitled "Integrated Analog Video Receiver," hereby incorporated by reference in its entirety, which claims priority from the following U.S. Provisional Applications:

| Appn. No. | Filing Date | Title |
|---|---|---|
| 60/567,191 | Apr. 30, 2004 | DSP-BASED ULTRA LOW-POWER TUNER/DECODER ARCHITECTURE |
| 60/612,108 | Sep. 21, 2004 | ADAPTIVE PICTURE-QUALITY CONTROL IN MOBILE ANALOG VIDEO RECEIVERS |
| 60/612,282 | Sep. 21, 2004 | RESOLUTION-ADAPTIVE POWER CYCLING FOR ANALOG VIDEO RECEIVERS |
| 60/623,193 | Oct. 29, 2004 | A ZERO-IF ANALOG VIDEO RECEIVER ARCHITECTURE |
| 60/634,468 | Dec. 9, 2004 | ADAPTIVE IMAGE REJECTION CALIBRATION FOR DIRECT-CONVERSION RECIEVERS |

FIELD OF THE INVENTION

The present invention relates to the field of analog video reception.

BACKGROUND

Historically, tuner demodulators ("tuner cans") for video band applications have been implemented entirely in the analog domain, using up to several hundred discrete components and consuming as much as two to three watts of power. Unfortunately, despite their low cost and robust performance, power and size considerations make discrete tuner cans unsuitable for a number of emerging video applications, such as analog video reception on mobile telephones, personal digital assistants, laptop computers or other small portable devices.

To meet the demand for small, low-power tuners, designers have begun implementing tuners in silicon, in most cases with architectures that mimic the superheterodyne operation of discrete tuner cans; down-converting the carrier frequency of a desired channel to a fixed intermediate frequency (IF), then passing the IF signal through an image-rejection stage to filter spectral components at image frequencies. Unfortunately, the notoriously poor performance of integrated passives makes it difficult to achieve a satisfactory balance between image rejection and power consumption. Consequently existing silicon tuners typically exhibit either compromised performance at low power, or reasonable performance at high power.

BRIEF DESCRIPTION OF THE DRAWINGS

The present invention is illustrated by way of example, and not by way of limitation, in the figures of the accompanying drawings and in which like reference numerals refer to similar elements and in which:

FIG. 3 illustrates an exemplary embodiment of an offset canceller;

FIG. 4 illustrates a more detailed embodiment of an offset canceller;

FIG. 5 illustrates a digital embodiment of an offset canceller;

FIG. 11 illustrates an embodiment of a video decoder that may be used to implement the decoder 103 of FIG. 1;

FIG. 12 illustrates an embodiment of a power manager that may be used to place an analog video receiver into a low power mode during intervals in which superfluous video information would otherwise be received; and FIG. 13 is a timing diagram that illustrates the operation of the power manager of FIG. 12.

DETAILED DESCRIPTION

Figure 1:
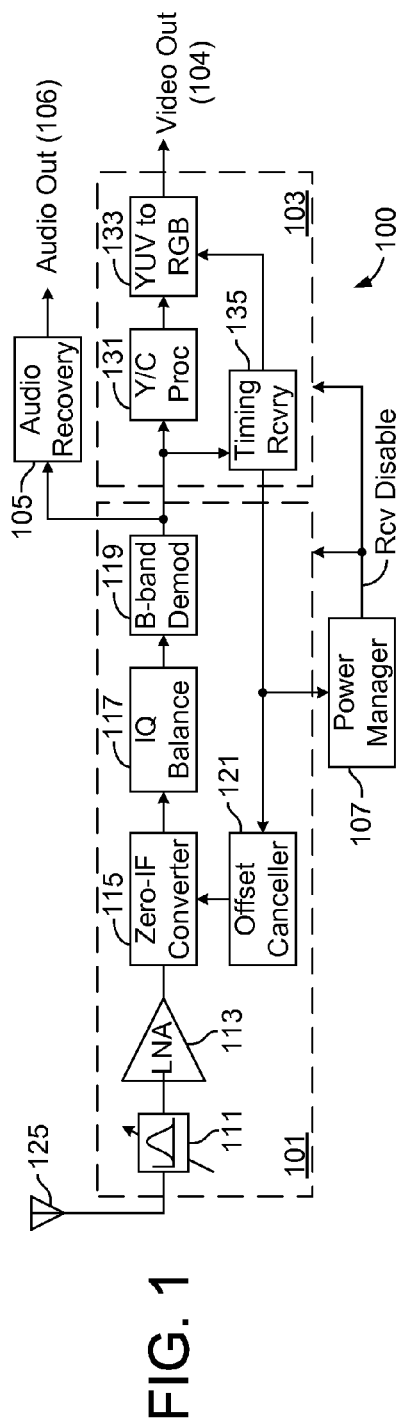
FIG. 1 illustrates a direct-conversion analog video receiver according to one embodiment.

In the following description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. Also signals referred to herein as clock signals may alternatively be strobe signals or other signals that provide event timing. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as connections through one or more intermediary circuits or structures. The term "exemplary" is used herein to express an example, not a preference or requirement.

An integrated analog video receiver is disclosed herein in various embodiments. In a number of embodiments, the analog video receiver includes a direct-conversion tuner that converts a broadcast-frequency analog video signal directly to baseband, rather than first down-converting to a mid-range intermediate frequency. By this operation, the image frequency is the frequency of the desired signal itself, so that the large, power-hungry channel selection filter typically stationed at the intermediate-frequency (IF) output stage of a conventional superheterodyne tuner may be replaced by a significantly smaller and lower power low-pass filter. In other embodiments, offset cancellation circuitry is provided to dynamically cancel offsets that may result from local oscillator coupling back into the signal input of the direct-conversion stage, and an IQ balance circuit is provided to adaptively reject undesired images that may result from phase and gain imbalance in the direct conversion stage. In yet other embodiments, a power management circuit is provided to power down selected components of the analog video receiver during intervals in which otherwise superfluous video information would be received. These and other embodiments and aspects of the invention are described in further detail below.

FIG. 1 illustrates a direct-conversion analog video receiver 100 according to one embodiment. The analog video receiver 100 includes a direct-conversion tuner 101, video decoder 103, audio recovery stage 106 and power manager 107, any or all of which may be integrated onto a single integrated circuit (IC) device, referred to herein as a host IC. The host IC may be a single IC die or an IC package containing two or more die (e.g., a multi-chip module). Also, the host IC may itself be a component of any number of host systems including, without limitation, consumer electronics devices (e.g., television sets, mobile telephones, personal computers, personal digital assistants (PDAs), video players, set-top boxes, etc.), military video-reception systems, television systems provided within various type of transport vehicles (e.g., automobiles, aircraft, trains, watercraft, etc.) and so forth. The host system may include various types of user-interface for receiving user-supplied channel selections, configuration information, and the like, as well as a display to display a video signal recovered by the analog video receiver 100 and, optionally, an audio transducer to generate an audible output of an audio signal recovered by the analog video receiver 100.

In the embodiment of FIG. 1, the direct-conversion tuner 101 includes an input-tracking filter 111, a low-noise amplifier 113, a zero-IF (zero intermediate-frequency) converter 115, IQ balance stage 117, baseband demodulator 119 and offset canceller 121. The input-tracking filter 111 is coupled to a signal source 125 (e.g., an antenna or jack for receiving a cable or other electrically or optically conductive medium) and is tuned to pass a frequency band containing a desired analog video signal. More specifically, in one embodiment, the input tracking filter 111 is a pass band filter tuned in response to a user-specified channel selection to one of a number of video signal channels, each selectable channel having a different center frequency within a larger spectrum set aside for analog video transmission. In one embodiment, for example, the transmission spectrum corresponds to a terrestrial broadcast spectrum (e.g., 50-850 MHz), although virtually any frequency range may be encompassed within the transmission spectrum in alternative embodiments (e.g., a cable transmission spectrum from 50 MHz-1 GHz, or any other spectrum). The selected analog video signal is amplified by the low-noise amplifier 113 (which may also be tuned to provide gain at the selected pass band), then passed to the zero-IF converter 115. Note that the input-tracking filter and/or the low-noise amplifier may be omitted from the direct-conversion tuner and implemented, for example, in a separate integrated circuit device or in a discrete-component circuit. Also, the positions of the low noise amplifier 113 and filter 111 may be interchanged so that the incoming signal is amplified before being filtered and, in some applications, the filter 111 may be omitted altogether.

In one embodiment, the zero-IF converter 115 is a synchronous detector that multiplies the incoming analog video signal by a complex sinusoid, thus down-converting the video signal directly to baseband and producing in-phase (I) and quadrature (Q) baseband signal components that are output to the IQ Balance stage 117. In one embodiment, the complex sinusoid is generated at a frequency that matches (or substantially matches) the center frequency of the selected pass-band, a frequency referred to herein as the carrier frequency of the incoming analog video signal. It should be noted that, due to the side-band filtering applied in vestigial side-band (VSB) modulated television signals, the carrier frequency of the incoming analog video signal may be offset from the frequency of the original modulated carrier (e.g., offset by $F_C/2$, where $F_C$ is the spectral reduction achieved by sideband filtering).

Still referring to FIG. 1, the IQ balance stage 117 compensates for gain and phase error in the zero-IF converter 115 to produce balanced (i.e., substantially image-free) I and Q component signals, and the baseband demodulator 119 recovers the final baseband video signal from the balanced I/Q signals. The offset canceller is provided to compensate for an undesired direct-current (DC) offset that may result from coupling of a local oscillator within the zero-IF converter back into the receiver input. IQ balance, baseband demodulation and offset cancellation operations are all described below in reference to more detailed embodiments.

The audio recovery stage 105 recovers an audio output from an audio component, if any, in the output of the baseband demodulator 119 (or alternatively from the output of the IQ Balance stage 117 or zero-IF converter 115). For example, in one embodiment, the audio recovery stage 105 includes a band pass filter to pass the audio component of the baseband demodulator output and a demodulator to recover the audio output from a frequency-modulated (FM) or amplitude-modulated (AM) digital audio signal. If the audio component has not already been digitized in earlier stages, the audio recovery stage 105 may also include an analog-to-digital converter (ADC) and corresponding digital filter to generate a filtered digital representation of the audio signal. An audio trap, not shown in FIG. 1, may be provided in the video path (e.g., at the input to the video decoder 103) to prevent the audio signal from reaching downstream video processing stages. The audio recovery stage 105 may be implemented in various other analog and/or DSP-based circuits (or processes) in alternative embodiments.

Continuing with the video path, the baseband demodulator 119 outputs the recovered baseband video signal to a timing-recovery stage 135 and luma-chroma processing stage 131 within the decoder 103. The luma-chroma processing stage 131 extracts chroma (color) information, if any, from the baseband video signal and provides corresponding hue (U) and saturation (V) signals to a format conversion stage 133 along with a luma (intensity) signal (Y) that remains after the color information is extracted. In one embodiment, the format conversion stage 133 is a YUV to RGB converter that converts the incoming intensity, hue and saturation signals into red, green and blue signals for driving a color display (e.g., a cathode-ray tube (CRT), liquid crystal display (LCD), plasma display, projected display or any other type of image rendering device). In alternative embodiments, the format conversion stage 133 may convert the YUV components into another signaling format (e.g., YIV signals), or the formatting stage may be omitted and the YUV signal components used to directly drive the host-system display.

The timing recovery stage 135 (which may be viewed as part of the tuner, rather than the decoder) extracts vertical retrace and horizontal retrace timing signals, referred to herein as v-sync and h-sync signals, respectively, from the tuner-supplied video signal and outputs the timing signals to the format conversion stage 133 where they are used to delineate frames, fields and scanlines (e.g., v-sync indicating the start of each video field in a field-interlaced video signal format, and h-sync indicating the start of a scanline to be displayed as a line of pixels on the display device). In the embodiment shown, the timing recovery stage may also output timing signals (h-sync, v-sync or both) to the offset canceller 121 and/or power manager 107 to time operations therein. In one embodiment, discussed in further detail below, the power manager 107 is used to shut down (i.e., disable or otherwise place in a reduced power consumption state) selected components of the tuner 101 and decoder 103 during intervals in which superfluous video information would otherwise be received. In alternative embodiments, the power manager 107 may be omitted.

Figure 2:
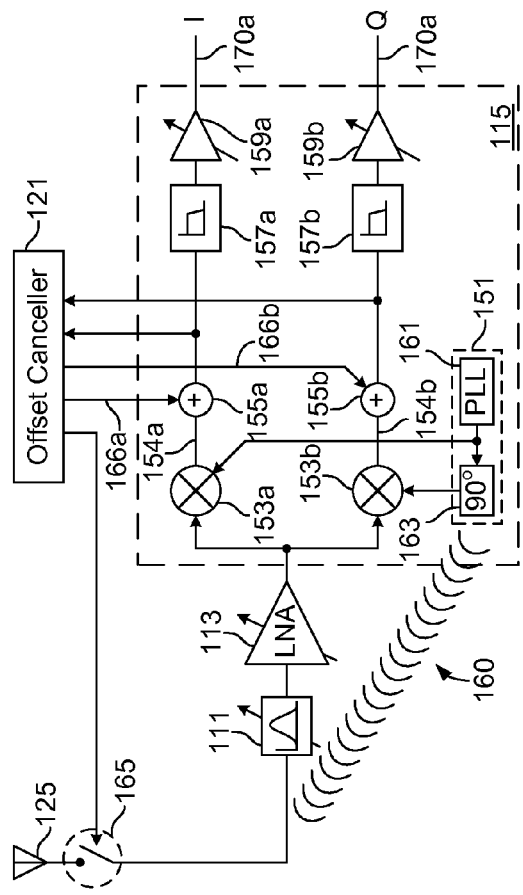
FIG. 2 illustrates an exemplary embodiment of a zero-intermediate-frequency (zero-IF) converter.

FIG. 2 illustrates an exemplary embodiment of the zero-IF converter 115 and its interconnection to the offset canceller 121, low noise amplifier 113 and input-tracking filter 111. The zero-IF converter 115 includes a local oscillator 151, mixer elements 153a, 153b (collectively, mixers 153), summing circuits 155a, 155b, low pass filters 157a, 157b, and buffer amplifiers 159a, 159b. In the embodiment shown, the local oscillator 151 is implemented by a phase-locked-loop 161 (PLL), and 90° delay element 163 that generate quadrature sinusoidal signals (e.g., sine and cosine) at a selected carrier frequency. In a specific implementation, for example, a divider circuit within the PLL 161 divides the output of a voltage-controlled oscillator (VCO) by a selected divisor (e.g., selected according to the center-frequency of a user-specified analog video channel) to generate a closed-loop control voltage that establishes the oscillating frequency of the VCO and therefore the frequency of the sinusoid output from the PLL. Designating the PLL output to be a cosine signal, passing the cosine wave through the 90° delay element 163 yields a sine wave (i.e., phase offset from the cosine wave by a quarter-cycle of the VCO oscillating frequency). The sine and cosine signals constitute quadrature sinusoids at the selected carrier frequency, $F_C$, and thus collectively form a complex sinusoid, $e^{j\omega t}$, where $\omega = 2\pi F_C$.

The cosine and sine signals generated by the local oscillator 151 are supplied to mixer elements 153a and 153b, respectively, where they are mixed (e.g., multiplied) with the incoming analog video signal to generate in-phase and quadrature video signals 154a and 154b. The mixer elements may be implemented, for example, by four-quadrant multiplier circuits (also called Gilbert cells) or any other circuit capable of performing a signal multiplication. The in-phase and quadrature video signals 154a and 154b are supplied to low-pass filters 157a, 157b which filter out the spectral components at $2F_C$ (i.e., multiplication of sinusoids at frequency $F_C$ yields the desired down-converted signal at baseband ($F_C - F_C$), and undesired components at $2F_C$ ($F_C + F_C$)), and then supplied to buffer amplifiers 159a, 159b to produce amplified I and Q baseband video signals 170a and 170b, respectively. Though not specifically shown, the I and Q signals 170a and 170b may be converted to digital signals in a video ADC stage before being output to the IQ balance stage (i.e., element 117 of FIG. 1). Also, signals 170a and 170b, or either of them, may be provided to the audio recovery stage (element 105 of FIG. 1) before or after conversion to digital form.

DC Offset Cancellation

One challenge presented by the direct conversion tuner 101 of FIG. 1 is that, as shown in FIG. 2 at 160, the radio-frequency (RF) sinusoids generated by the local oscillator 151 may couple into the sensitive amplifier of the tuner itself. More specifically, the RF sinusoids are generated at the frequency of the selected video channel, and consequently, if picked up by the signal source (e.g., the antenna) will be passed by the input-tracking filter, amplified by the low-noise amplifier, and then mixed with themselves in the mixing elements 153. Unfortunately, a sinusoid mixed with itself yields a DC (direct-current) signal component (e.g., $\cos^2(\omega t) = [1+\cos(2\omega t)]/2$ and $\sin^2(\omega t) = [1-\cos(2\omega t)]/2$) that may cause buffer amplifiers 159a, 159b to saturate or otherwise disrupt operation of downstream receiver stages. The offset canceller 121 is provided to avoid such disruption by cancelling the DC component of the mixer output signals 154a, 154b.

In the embodiment of FIGS. 1 and 2, the offset canceller 121 receives a blanking signal from the timing recovery circuit 135 at the start of each blanking interval (e.g., horizontal blanking interval and/or vertical blanking interval) and disables reception of the incoming signal during at least a portion of the blanking interval, for example, by opening a switch 165. While signal reception is disabled, the offset canceller samples the mixer output signals 154a, 154b to obtain a measure of the DC offset, if any, then updates (i.e., adjusts) offset cancellation signal 166a, 166b according to the DC offset. The offset cancellation signals 166a, 166b are summed with the mixer outputs 154a, 154b, respectively, in summing circuits 155a, 155b to reduce the DC level of the mixer outputs 154a, 154b to a tolerable level (i.e., cancel the DC component). In alternative embodiments, the offset canceller 121 may operate without decoupling the tuner 101 from the signal source (i.e., switch 165 may be omitted), for example, if a measure of the DC offset may be obtained during reception of a nominally steady-state signal (e.g., during horizontal and/or blanking interval or a period in which the video signal is nulled at the transmission source).

FIG. 3 illustrates an exemplary embodiment of an offset canceller 201 and its interconnection to a summing circuit 155. The offset canceller 201 includes an amplifier 203 having an output coupled via signal-controlled switch 205 to a shunt capacitor 207. The shunt capacitor 207 effectively operates as a low-pass filter and sampling element, and may be replaced by various other low pass filter/sampling element implementations in alternative embodiments. When a blanking signal 210 (BL) is asserted, switch 205 is closed, enabling the amplifier 203 to charge the capacitor 207 in proportion to the DC level of the mixer output 154. The charge developed on the capacitor 207 constitutes an offset cancellation voltage that is applied to a control terminal of a current source 209 (e.g., a transistor gate) and thus controls the amount of current delivered to summing circuit 155. By configuring the summing circuit 155 such that an increased current from current source 209 reduces the DC signal level at the summing circuit output (i.e., summing circuit 155 effects a subtraction operation), a negative feedback loop is formed in which the amplifier 203 iteratively updates the offset cancellation voltage (each iteration occurring in a respective blanking interval) as necessary to cancel the DC component of the mixer output 154.

FIG. 4 illustrates a more detailed embodiment of an offset canceller 230, summing circuit 240 and their interconnection to a differential-output mixer cell 225. In the embodiment shown, the mixer cell 225 generates a current-mode differential output signal on output nodes 154a, 154b (e.g., as in a Gilbert cell) and is coupled, via pass gate switch 227 ("pass gate"), to a signal input source 125. When a differential blanking signal 250 (BL+/−) is asserted, pass gate 227 is opened, decoupling the mixer cell 225 from the input source 125 and thus enabling the mixer 225 to generate a current-mode error signal 226 that reflects undesired coupling of the local oscillator, as well as any 1/F noise (i.e., noise inversely proportional to the frequency) and any imbalance in the tuner stages up to and including the mixer cell 225. The summing circuit 240 includes resistive pull-up elements 241a, 241b to generate a differential error voltage on the mixer output nodes 154a, 154b in proportion to the current-mode error signal 226.

The offset canceller 230 includes a differential amplifier 231 having inputs coupled respectively to mixer output nodes 154a, 154b, and outputs coupled, via pass gates 233a, 233b to current-control transistors 237a, 237b. The pass gates 233a, 233b are switched to a conducting state in response to assertion of the blanking signal 250 so that, when the error signal is present on the mixer output nodes 154a, 154b, the differential amplifier 231 is enabled to drive the gates of current-control transistors 237a, 237b. More specifically, the differential amplifier 231 generates a differential offset cancellation voltage in proportion to the error voltage so that the current-control transistors 237a, 237b are biased to drive a differential, offset cancellation current ($I_{n1}$, $I_{n2}$) onto the mixer output nodes 154a, 154b. The source terminals of the current-control transistors 237a, 237b are cross-coupled to the mixer output nodes 154a, 154b (i.e., transistor 237a coupled to output node 154b, and transistor 237b coupled to output node 154a) to form a negative feedback loop, thereby enabling offset canceller 230 to iteratively adjust the offset cancellation current in a direction that drives the error signal on mixer output nodes 154a, 154b toward a null value (i.e., zero differential voltage). In one embodiment, a capacitive element 235 is coupled between the gate terminals of the current-control transistors 237a, 237b to maintain the offset cancellation voltage between blanking intervals. In alternative embodiments, separate capacitive elements may be coupled respectively to the gates of the current-controlled transistors 237a, 237b (e.g., each capacitive element coupled between ground and the gate terminal of a respective current-control transistor) to maintain the offset cancellation voltage. More generally, any circuit capable of maintaining the offset cancellation voltage during non-blanking intervals may be substituted for capacitive element 235 in alternative embodiments.

Although summing circuit 240 is depicted as a current-mode summing circuit is in FIG. 4 (i.e., a wired summing junction), other types of summing circuits may be used in alternative embodiments including, without limitation, voltage-mode summing circuits (e.g., using an operational amplifier), digital logic circuits and state machine operation (e.g., a programmed processor). Also, while the resistive elements 241a, 241b are shown as being included in the summing circuit 240, the resistive elements 241a, 241b may be disposed in downstream tuner or decoder stages in alternative embodiments.

FIG. 5 illustrates an embodiment of an offset canceller 270 that includes an analog-to-digital converter 271 (ADC), digital filter 273 and digital-to-analog converter 275 (DAC). The ADC 271 responds to assertion of a blanking signal 210 by generating a digitized sample of the error signal present on node 272, and outputting the error sample to digital filter 273. The digital filter 273 applies the incoming error sample in a digital filtering operation to generate an updated offset cancellation value 274. The digital filter 273 may be, for example, an infinite impulse response (IIR) filter, finite impulse response (FIR) filter or any other type of filter that generates a moving average (or other mathematical combination) of error samples received from the ADC 271. The offset cancellation value 274 is provided to the DAC 275 which generates a corresponding analog offset cancellation signal to be summed with the mixer output 154 in summing circuit 279, thus completing a negative feedback loop. As in embodiments discussed above, the summing circuit 279 may be a current-mode summing circuit (in which case the DAC may be a current-mode DAC), voltage-mode summing circuit, or any other type of summing circuit.

Adaptive Image Rejection

Figure 6:
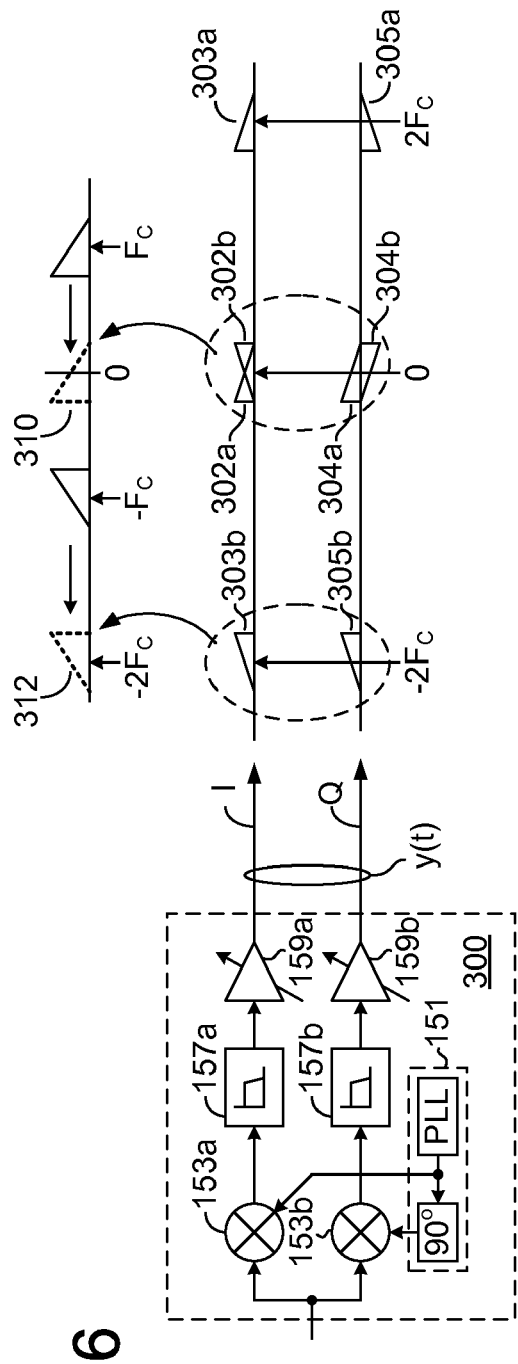
FIG. 6 illustrates in-phase and quadrature waveforms generated by the zero-IF converter of FIG. 2.

FIG. 6 illustrates in-phase and quadrature waveforms ideally generated by the zero-IF converter of FIG. 2. More specifically, the in-phase component (I) of the received baseband video signal, y(t), includes baseband images 302a and 302b that result from down-converting signal components at $\pm F_C$ to baseband, along with images 303a and 303b at $\pm 2F_C$. Similarly, the quadrature component (Q) of y(t) includes baseband images 304a and 304b and $2F_C$ images 305a and 305b. The baseband images 302, 304 and $2F_C$ images 303, 305 are shown as right triangles in FIG. 6 to indicate that they may be asymmetric about their respective center frequencies, as in the case of VSB modulation.

Assuming that the I and Q mixing paths within zero-IF converter 300 are precisely balanced (i.e., sinusoids generated by the local oscillator 151 are offset by precisely 90° and gains of amplifiers 159a and 159b are equal), the algebraic sum of the in-phase and quadrature components yields the baseband and $-2F_C$ spectral components shown at 310 and 312, respectively. That is, the negative frequency contributions to the baseband components of the I and Q output signals are inversions of one another that cancel when summed, leaving only the desired positive frequency contribution 310. Thus, in ideal zero-IF converter 300, multiplication by a precisely-generated complex sinusoid effectively down-converts both the positive and negative frequency components of a video signal centered at $\pm F_C$, yielding a desired baseband component 310, and a $-2F_C$ component 312 that may be removed by low-pass filter stages 157a and 157b (although FIG. 6 illustrates mixing with a complex sinusoid $e^{-j2\pi F_c t}$, it should be noted that the incoming video signal may alternatively be mixed with sinusoid $e^{+j2\pi F_c t}$ to up-convert the positive and negative frequency components of the $\pm F_C$-centered video signal, thus yielding a desired baseband component and a +2$F_C$ component that may be removed by low-pass filter stages 157a and 157b.

Figure 7B:
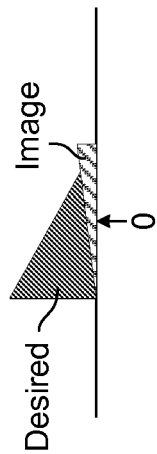
FIGS. 7A and 7B illustrates gain and phase errors that may occur in the zero-IF converter of FIG. 2 and the resulting undesired image that may fold onto the desired signal.
Figure 7A:
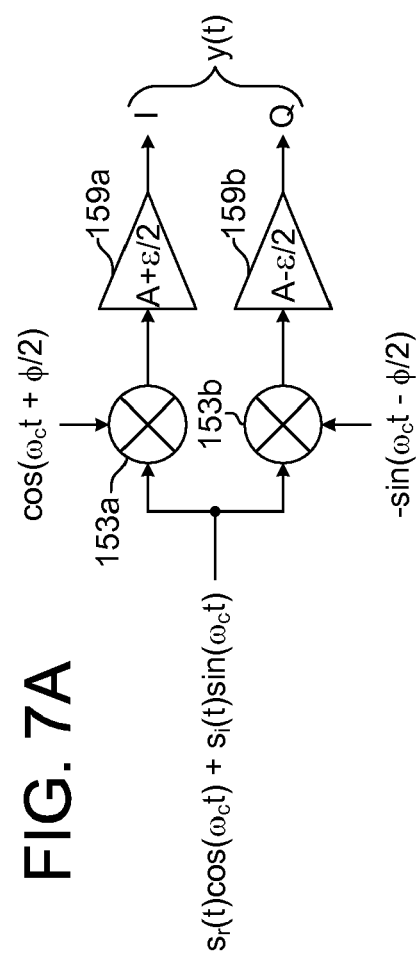

Unfortunately, actual circuit implementations generally yield some degree of phase error in the complex sinusoid and gain imbalance in the output gain stages. Referring to FIGS. 7A and 7B for example, a phase error, φ, may be viewed as being split between the sine and cosine components of the complex sinusoid (i.e., $\cos(\omega_C t+\phi/2)$ and $-\sin(\omega_C t-\phi/2)$) supplied to mixer elements 153a and 153b, and a gain error, ε, may be viewed as being split between amplifiers 159a and 159b so that the amplifiers 159a, 159b yield gains of A+ε/2 and A−ε/2, respectively. As a result of the phase and gain errors, the in-phase and quadrature components of y(t), in effect, leak into one another so that, instead of the idealized cancellation of negative frequency contributions shown in FIG. 6, some portion of the negative frequency contribution appears as an undesired image in the IQ output as shown in FIG. 7B. If large enough, the image may produce undesired artifacts in the output video signal.

In one embodiment, undesired image resulting from phase and gain error in the zero-IF converter, is corrected by an adaptive image rejection filter implemented in the IQ balance stage 117 of FIG. 1. More specifically, recognizing that the error signal that yields the undesired image is a scaled complex conjugate of the desired signal x(t), it follows that the received baseband signal, y(t), may be expressed as a sum of the desired signal x(t) and its conjugate. That is, if the desired signal x(t)=I(t)+jQ(t), then the error signal is given by β[I(t)−jQ(t)]=βx*(t), where '*' denotes a complex conjugate. Accordingly, the received baseband signal, y(t), may be expressed as:

$$y(t)=\alpha x(t)+\beta x^*(t) \quad (1),$$

where α and β represent the relative proportions of the desired and error signals and are complex functions of the phase and gain errors as follows:

$$\alpha = [(1-\varepsilon/2)e^{-j\phi/2} + (1+\varepsilon/2)e^{+j\phi/2}]/2$$

$$\beta = [(1+\varepsilon/2)e^{-j\phi/2} - (1-\varepsilon/2)e^{+j\phi/2}]/2.$$

Recognizing further that the readily obtainable complex conjugate of the received signal, y*(t), contains an x*(t) component, it follows that by subtracting a properly scaled version of the complex conjugate of the received signal from the received signal itself, the error component of the received signal may be canceled, leaving a linearly scaled version of the desired signal. That is:

$$y^*(t)=\alpha^* x^*(t)+\beta^* x(t), \text{ so that}$$

$$(\beta/\alpha^*)y^*(t)=\beta x^*(t)+(\beta\beta^*/\alpha^*)x(t) \quad (2).$$

Now, combining the simultaneous equations (1) and (2) to cancel the error term β*x(t) yields:

$$y(t)-(\beta/\alpha^*)y^*(t)=(\alpha-\beta\beta^*/\alpha^*)x(t)=z(t) \quad (3).$$

Thus, as shown in expression (3), the error signal may be eliminated by taking the complex conjugate of y(t), multiplying by the scaling factor β/α* and then subtracting the result from y(t), leaving z(t), a linearly scaled version of the desired signal, x(t).

Figure 8:
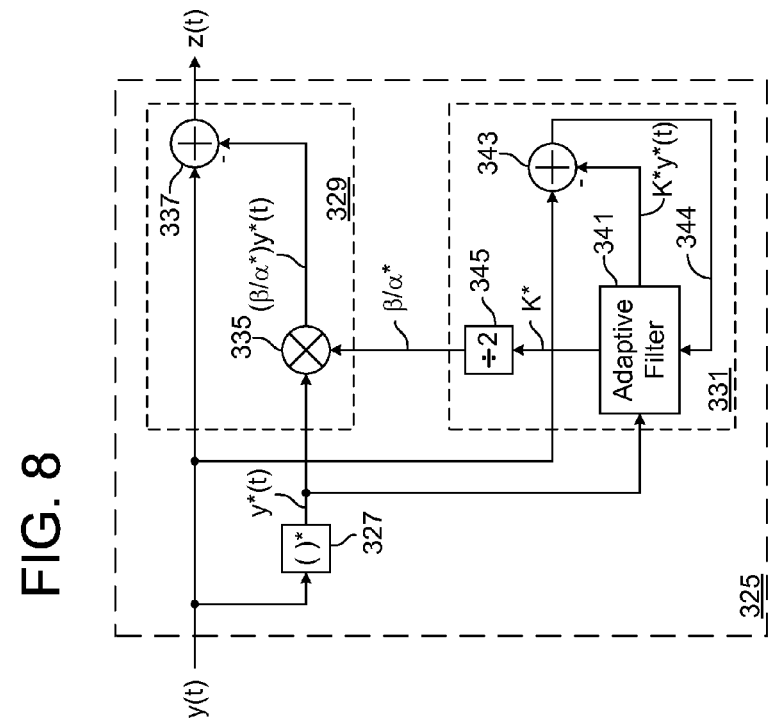
FIG. 8 illustrates an embodiment of an adaptive image rejection filter.

FIG. 8 illustrates an embodiment of an adaptive image rejection filter 325 that operates in accordance with expression (3) and that may be used to implement the IQ balance stage 117 of FIG. 1. The adaptive image rejection filter 117 includes a conjugate generator 327, cancellation path 329 and adaptation loop 331. The conjugate generator 327 generates a complex conjugate, y*(t), of the input baseband video signal, y(t), by inverting the imaginary component of the complex signal. In one embodiment, the input signal, y(t), has been digitized (e.g., by an ADC at the front end of the IQ balance stage 117 or back end of the zero-IF inverter stage) so that the conjugate generator may simply flip the sign bit of the imaginary component of the input signal. Alternatively, in an analog implementation, the complex conjugate may be generated by twisting a differential signal-line pair that carries the imaginary component of the incoming signal.

However generated, the complex conjugate is supplied to a multiplier 335 within cancellation path 329 where it is multiplied with a β/α* scaling factor received from the adaptation loop 343, thereby producing the desired scaled complex conjugate value, (β/α*)y*(t). The scaled complex conjugate value is supplied to an inverting input of summing circuit 337 where it is subtracted from the input baseband video signal y(t) to produce the desired output signal z(t).

The adaptation loop 331 is provided to generate the scaling factor, β/α*, applied within the cancellation path 329. In the embodiment of FIG. 8, the adaptation loop 331 includes an adaptive filter 341 and summing circuit 343 coupled in a negative feedback configuration that attempts to minimize a difference between the input baseband video signal, y(t) and its filtered complex conjugate K*y*(t). That is, the complex conjugate y*(t) is scaled by the filter coefficient (K*) to produce a filtered conjugate, K*y*(t). The summing circuit 343 receives the input signal y(t) and filtered conjugate at non-inverting and inverting inputs, respectively, and thus subtracts K*y*(t) from y(t) to produce a difference signal 344 that is fed back to the adaptive filter. The adaptive filter iteratively adjusts the filter coefficient, K*, in response to the difference signal 344. In one embodiment, for example, a least-mean-squares (LMS) adaptive update is applied in each iteration as follows:

$$K[n+1]=K[n]+\mu e^*[n]y^*[n] \quad (4),$$

where μ is a scaling factor and e*[n] is the conjugate of the difference signal 344 for a given update. Iterative application of expression (4) can be algebraically shown to cause K, the conjugate of the filter coefficient, to converge to:

$$K=2\alpha^*\beta^*/(\beta\beta^*+\alpha\alpha^*) \quad (5),$$

so that the filter coefficient, K* (which may be generated by a conjugate operation in the update equation or through a separate conjugate operation) converges to:

$$K^*=2\alpha\beta/(\beta\beta^*+\alpha\alpha^*) \quad (6).$$

Because α is significantly larger than β, expression (6) may be simplified to:

K*=2αβ/(αα*)=2β/α, or twice the scaling factor to be applied in the cancellation path. Accordingly, the filter coefficient, K*, is output from the adaptive filter 341 to divider circuit 345 which divides K* by two to yield the β/α* scaling factor applied in the cancellation path 329.

Still referring to FIG. 8, it should be noted that instead of a LMS update operation, sign-sign LMS updates may be effected in the adaptive filter 341. More generally, any adaptive update approach or one-time or occasional calibration operation that will yield the desired scaling factor may be used in alternative embodiments. Further, while individual circuit components for performing multiplication, conjugate and summing operations are depicted in FIG. 8, all such operations or any subset thereof may be performed in a programmed processor.

Figure 9A:
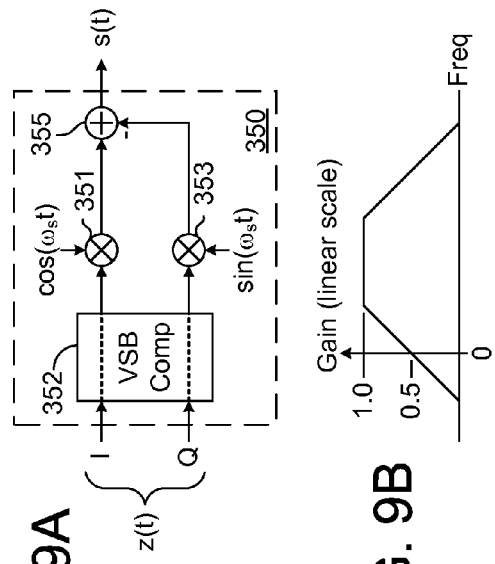
FIG. 9A illustrates an embodiment of the baseband demodulator of FIG. 1.
Figure 9B:
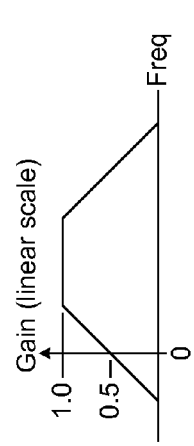
FIG. 9B illustrates the frequency response of an exemplary filter used to implement a vestigial sideband compensator within the baseband demodulator of FIG. 9A.
Figure 10A:
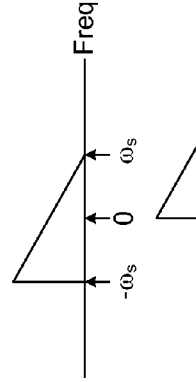
FIG. 10A illustrates the complex spectrum of a signal received within the baseband demodulator of FIG. 9A.
Figure 10B:
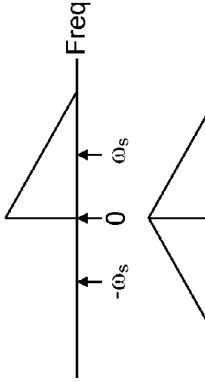
FIG. 10B illustrates the complex signal spectrum that results from up-conversion within the baseband demodulator of FIG. 9A.
Figure 10C:
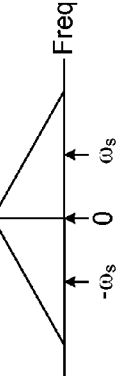
FIG. 10C illustrates the real signal that results from a combination of in-phase and quadrature signal components in the baseband demodulator of FIG. 9A.

FIG. 9A illustrates an embodiment of the baseband demodulator 119 of FIG. 1. The baseband demodulator 119 is provided to compensate for the vestigial sideband nature of the signal prior to frequency translation, and then frequency-shift the complex signal, z(t), received from the IQ balance stage such that, when the quadrature signal component is subtracted from the in-phase component of the signal, the imaginary component of z(t) is canceled, leaving only the desired, real signal component, r(t). In the particular embodiment shown, the baseband demodulator includes a vestigial sideband compensator 352 implemented, for example, as a Nyquist filter with the frequency response shown in FIG. 9B. Other compensator structures and filter responses can be utilized in alternative embodiments. After the compensator 352, a first mixing element 351 is coupled to receive the in-phase component (I) of the incoming signal z(t) and a second mixing element 353 is coupled to receive the quadrature component (Q) of z(t). Assuming that the incoming signal has the complex spectrum shown in FIG. 10A (i.e., the right-triangle representing the asymmetric 2 $\omega_S$ spectrum of a VSB centered at zero hertz), and by providing cosine and sine demodulating signals at frequency $\omega_S$ to mix elements 351 and 353, respectively, the z(t) is up-converted by frequency $\omega_S$ as shown in FIG. 10B. By subtracting the $\omega_S$-shifted quadrature signal component from the $\omega_S$-shifted in-phase signal in summing circuit 355 the imaginary component of the complex signal is effectively canceled, yielding the desired, real video signal, s(t), having the waveform shown at FIG. 10C. In the context of a VSB color television signal, s(t) is a double-sideband signal having a luma carrier centered at zero hertz and an offset chroma carrier. Note that the local oscillator used to generate the complex sinusoid within the zero-IF converter may include a secondary divide loop to generate the sinusoids applied within the baseband demodulator. In the embodiment above, the local oscillator is assumed to be coherent with the received signal, such coherency being achieved through any number of frequency-tracking techniques (e.g., carrier recovery). In alternative embodiments, the local oscillator need not be coherent with the received signal and envelope detection or other incoherent recovery techniques may be used.

Decoder with Dynamic Frame-Hold

FIG. 11 illustrates an embodiment of a video decoder 400 that may be used to implement the decoder 103 of FIG. 1, and its interconnection to a video buffer 411. The video decoder 400 includes a luma/chroma processing stage 131, an optional format decoder 133, a timing recovery circuit 135 and a signal-to-noise ratio (SNR) detector 407. In one embodiment, the luma/chroma processing stage 131 includes a luma/chroma separator 401 and luma/chroma processing circuits 403 and 405 which deliver separated chroma and luma signals to the format converter 133. In one embodiment, the luma/chroma separator 401, processing circuits 403, 405 and format converter 133 collectively perform a video decoding operation in accordance with NTSC, PAL or SECAM standards, to yield a standard RGB video output signal (i.e., either NTSC, PAL or SECAM). In alternative embodiments, the video output signals based on other standards, or non-standard output formats may be generated. The timing recovery circuit 135 operates generally as described above to recover vertical and horizontal synchronization signals from the demodulated video signal, s(t), and deliver the synchronization signals to the format converter 133 (i.e., to enable delineation of fields and scanlines) and, if necessary to other circuit components with a video receiver, such as the offset canceller described above. The SNR detector 407 measures the signal-to-noise ratio (SNR) of the demodulated video signal, s(t), and compares the SNR with a threshold value. If the SNR falls below the threshold, the incoming signal is deemed too noisy to display and the SNR detector 407 asserts a frame-hold signal 408. The threshold value may be programmable (e.g., a value recorded within a configuration register of the host IC) to enable a user-selected noise tolerance. Also, in alternative embodiments, measures of signal quality other than SNR may be used, alone or in combination with the SNR, in determining whether to assert or deassert the frame hold signal.

In the embodiment of FIG. 11, the video buffer 411 includes a frame buffer 413, summing circuit 415 and multiplexer 417. While the frame-hold signal 408 is deasserted, a first field buffer within frame buffer 413 is loaded with scanline information (i.e., pixel data to be displayed on a given line of a display device) for an incoming video field, while scanline information is read out of a second field buffer and passed to the video output 420 via multiplexer 417. When the first field buffer is filled, the video buffer 411 begins loading the second field buffer while scanline information is read out of the first field buffer, thus effecting an alternating (ping-pong) buffer arrangement. When the frame hold signal 408 is asserted, scanline loading within the frame buffer 413 is halted (i.e., a frame hold condition), and the scanline information generated by the video decoder 400 is summed with corresponding scanline information previously loaded into the frame buffer 413 to produce a time-averaged picture output. By this operation, the user may be presented with a relatively frozen picture instead of the "snow" that generally results from a lost video signal.

Dynamically Disabled Receiver

As discussed above, in reference to FIG. 1, a power management circuit 107 may be provided to shut down selected components within the tuner 101 and decoder 103 during intervals in which superfluous video information would otherwise be received. For example, in many small-screen video display devices, standard-format video signals convey more information than necessary to drive the display. In such devices, reception of non-displayed video information (superfluous video information from the standpoint of the video device) represents an unnecessary power expenditure, which, in the integrated analog video receiver 100 of FIG. 1 may be avoided through operation of the power manager 107. In one embodiment, the host system may display only one field per video frame, so that the power manager 107 may disable any or all components within the tuner 101 and/or decoder 103 during the interval in which the superfluous frame would otherwise be received, thus reducing video receiver power consumption as much as 50% (or nearly 50%). In another embodiment, the host system may discard (i.e., refrain from displaying) every Nth scanline, so that the power manager 107 may disable selected components of the tuner/decoder after reception of each set of N-1 scanlines to save power. The power manager 107 may also periodically disable power during periods of lost signal (e.g., as indicated by the SNR detector 407 of FIG. 11), occasionally enabling operation of the tuner/decoder to sample the incoming video signal and determine whether the signal has been restored.

FIG. 12 illustrates a power manager 440 according to an embodiment that disables operation of the tuner and/or decoder (including any or all components thereof) during every other video field interval. That is, as shown in FIG. 13, at every other assertion of v-sync pulse 452, the power manager asserts a disable signal 446 to prevent reception (and thus save power) of the h-sync pulses 454 and scanline information that constitute a video field. In the embodiment of FIG. 12, the power manager 440 includes a toggle-configured flip-flop 441 (i.e., inverting output coupled to data input), saturating counter 443 and logic AND gate 445. The strobe input of the flip-flop 441 is coupled to receive v-sync so that the flip-flop output toggles at each v-sync pulse and is thus referred to herein as the v-sync toggle signal 442 (VST). In one embodiment, the power manager 440 is designed to enable reception of each v-sync pulse 452 (e.g., to enable proper operation of the timing recovery circuit 135 of FIG. 1) and therefore asserts the disable signal 446 for a number of h-sync pulses 454 that correspond to a video field, and then deasserts the disable signal 446 in time to enable reception of the next v-sync pulse. (As discussed above, the h-sync pulses 454 may be synthesized by a PLL that receives v-sync at its reference clock input and divides a VCO output by the ratio of h-sync pulses to v-sync pulses for the relevant video standard.) More specifically, the counter 443 is reset to an initial count value in response to a rising edge of the v-sync toggle signal 442 (i.e., the start of a superfluous video field) and then counts up or down toward a terminal count value in response to following h-sync pulses 454. By programming (or hard-coding or hardwiring) the difference between the terminal count and initial count values to match the number of scanlines per video field, the counter 443 counts up or down during interval in which the superfluous scanlines would otherwise be received, reaching the terminal count value and asserting a corresponding terminal count signal 444 (tc) when the final h-sync pulse is counted. The terminal count signal 444 and v-sync toggle signal 442 are supplied to inverting and non-inverting inputs, respectively, of logic AND gate 445. By this arrangement, the low state of terminal count signal 444 and high state of the v-sync toggle signal 442 generated during the superfluous field interval cause AND gate 445 to raise the disable signal 446, as shown in FIG. 13 at 458. When the terminal count signal 444 goes high at 460, marking the end of the superfluous field interval, logic AND gate 445 lowers the disable signal 446 as shown at 462. The v-sync toggle signal 442 is supplied to a reset input of the counter 443 so that, when the v-sync toggle signal 442 goes high at the start of the next superfluous field (e.g., shown at 464), counter 443 is reset to the initial value and thus enabled to count another field of h-sync pulses 454.

It should be noted that numerous changes may be made to the power manager 440 without departing from the spirit and scope of the invention. For example, the power manager may be implemented by a programmed processor instead of dedicated circuitry. Also, one or more configuration values may be supplied to the power manager 440 to establish the number of h-sync pulses to be skipped, thereby enabling power manager 440 to be configured for operation in accordance with different video standards (e.g., 625 scanline PAL standard vs. 525 scanline NTSC standard). Further, as discussed above, rather than disabling reception of the scanlines of every other video field, reception may be disabled for every Nth scanline.

Electronic Expression of Circuits and/or Processes

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Section headings have been provided in this detailed description for convenience of reference only, and in no way define, limit, construe or describe the scope or extent of such sections. Also, while the invention has been described with reference to specific embodiments thereof, it will be evident that various modifications and changes may be made thereto without departing from the broader spirit and scope of the invention. Accordingly, the specification and drawings are to be regarded in an illustrative rather than a restrictive sense. In the event that provisions of any document incorporated by reference herein are determined to contradict or otherwise be inconsistent with like or related provisions herein, the provisions herein shall control at least for purposes of construing the appended claims.

What is claimed is:

1. An integrated circuit device, coupled to a signal source that receives a broadcast spectrum from an electrically or optically conductive medium, to output video signals corresponding to a selected channel which is one of a plurality of channels of the broadcast spectrum, the integrated circuit device comprising:

tuner circuitry, coupled to the signal source, to receive a broadcast-frequency analog video signal, having timing information embedded therein, and to output a video signal which corresponds to the selected channel of the broadcast spectrum, the tuner circuitry including:

amplifier circuitry, coupled to the signal source, to generate and output an amplified representation of at least a portion of the broadcast-frequency analog video signal;

mixing circuitry, coupled to the amplifier circuitry, to receive the amplified representation of at least a portion of the broadcast-frequency analog video signal and to generate a first signal having an in-phase component and a quadrature component, wherein the mixing circuitry mixes the amplified representation of at least the portion of the broadcast-frequency analog video signal with a complex sinusoidal signal having a frequency which is at least substantially equal to a frequency which is associated with the selected channel of the broadcast spectrum;

local oscillator circuitry, coupled to the mixing circuitry, to generate and output the complex sinusoidal signal; and baseband demodulator circuitry, coupled to the mixing circuitry, to generate and output a baseband video signal, which corresponds to the selected channel, using the first signal; and video decoder circuitry, coupled to the baseband demodulator circuitry, to generate and output a formatted video signal, which corresponds to the selected channel of the broadcast spectrum, using the baseband video signal, the video decoder circuit being configured to provide a timing signal to the tuner circuitry for generating a cancellation signal.

2. The integrated circuit device of claim 1 wherein the video decoder circuitry includes:

processing circuitry, coupled to the baseband demodulator circuitry, to process the baseband video signal, the processing circuitry including:

luma circuitry to generate a second signal using the baseband video signal, wherein the second signal is representative of a luma signal corresponding to the selected channel;

timing recovery circuitry to generate a timing signal using the timing information within the broadcast-frequency analog video signal; and format circuitry, coupled to the processing circuitry, to generate and output the formatted video signal, corresponding to the selected channel, using the second signal and the timing signal.

3. The integrated circuit device of claim 1 wherein the video decoder circuitry includes:

processing circuitry, coupled to the baseband demodulator circuitry, to process the baseband video signal, the processing circuitry including:

luma circuitry to generate a second signal using the baseband video signal, wherein the second signal is representative of a luma signal corresponding to the selected channel; and chroma circuitry to generate a third signal using the baseband video signal, wherein the third signal is representative of a chroma signal corresponding to the selected channel;

timing recovery circuitry to generate a timing signal using the timing information within the broadcast-frequency analog video signal; and format circuitry, coupled to the processing circuitry, to generate and output the formatted video signal, corresponding to the selected channel, using the second signal, the third signal and the timing signal.

4. The integrated circuit device of claim 1 further including filter circuitry, coupled to an input of the mixing circuitry, to generate a filtered representation of the amplified representation of at least a portion of the broadcast-frequency analog video signal and wherein the mixing circuitry generates and outputs the first signal using the filtered representation of the amplified representation of at least a portion of the broadcast-frequency analog video signal.

5. The integrated circuit device of claim 4 wherein the filter circuitry includes a pass-band filter having a pass-band that corresponds to and changes in accordance with the selected channel.

6. The integrated circuit device of claim 5 wherein each channel of the plurality of channels of the broadcast spectrum includes a center frequency and wherein the pass-band of the pass-band filter includes a center frequency which correlates to the center frequency of the selected channel.

7. The integrated circuit device of claim 1 further including filter circuitry, coupled to the amplifier circuitry, to generate a filtered representation of the broadcast-frequency analog video signal and wherein the amplifier circuitry generates the amplified representation of at least a portion of the broadcast-frequency analog video signal using the filtered representation of the broadcast-frequency analog video signal.

8. The integrated circuit device of claim 7 wherein the filter circuitry includes a pass-band filter having a pass-band that corresponds to and changes in accordance with the selected channel.

9. The integrated circuit device of claim 8 wherein each channel of the plurality of channels of the broadcast spectrum includes a center frequency and wherein the pass-band of the pass-band filter includes a center frequency which correlates to the center frequency of the selected channel.

10. The integrated circuit device of claim 1 wherein the mixing circuitry includes:

a first mixer to mix the amplified representation of at least the portion of the broadcast-frequency analog video signal with a first sinusoidal signal to generate the in-phase component, and a second mixer to mix the amplified representation of at least the portion of the broadcast-frequency analog video signal with a second sinusoidal signal to generate the quadrature component.

11. A system, coupled to a signal source that receives a broadcast spectrum from an electrically or optically conductive medium, to output video signals corresponding to a selected channel which is one of a plurality of channels of the broadcast spectrum, the system comprising:

filter circuitry, coupled to the signal source, to receive a broadcast-frequency analog video signal and to generate a filtered representation of the broadcast-frequency analog video signal; and an integrated circuit, coupled to the filter circuitry, comprising:

tuner circuitry, coupled to the filter circuitry, to receive the filtered representation of the broadcast-frequency analog video signal and to output a baseband video signal, which corresponds to the selected channel of the broadcast spectrum, the tuner circuitry including:

amplifier circuitry, coupled to the filter circuitry, to generate and output a first signal using the filtered representation of the broadcast-frequency analog video signal, wherein the first signal is an amplified representation of at least a portion of the broadcast-frequency analog video signal;

mixing circuitry, coupled to the amplifier circuitry, to receive the amplified representation of at least a portion of the broadcast-frequency analog video signal and to generate a second signal having an in-phase component and a quadrature component, wherein the mixing circuitry mixes the first signal with a complex sinusoidal signal having a frequency which is at least substantially equal to a frequency which is associated with the selected channel of the broadcast spectrum;

baseband demodulator circuitry, coupled to the mixing circuitry, to generate and output the baseband video signal, which corresponds to the selected channel, using the second signal; and video decoder circuitry, coupled to the tuner circuitry, to receive the baseband video signal and output a formatted video signal corresponding to the selected channel of the broadcast spectrum, the video decoder circuit being configured to provide a timing signal to the tuner circuitry for generating a cancellation signal.

12. The system of claim 11 wherein the integrated circuit device further includes local oscillator circuitry, coupled to the mixing circuitry, to generate and output the complex sinusoidal signal.

13. The system of claim 11 wherein the video decoder circuitry includes:
  processing circuitry, coupled to the baseband demodulator circuitry, to process the baseband video signal, the processing circuitry including:
    luma circuitry to generate a third signal using the baseband video signal, wherein the third signal is representative of a luma signal corresponding to the selected channel;
  timing recovery circuitry, coupled to the tuner circuitry, to generate a timing signal using the timing information within the broadcast-frequency analog video signal; and
  format circuitry, coupled to the processing circuitry, to generate and output the formatted video signal, corresponding to the selected channel, using the third signal, the fourth signal and the timing signal.

14. The system of claim 11 wherein the video decoder circuitry includes:
  processing circuitry, coupled to the baseband demodulator circuitry, to process the baseband video signal, the processing circuitry including:
    luma circuitry to generate a third signal using the baseband video signal, wherein the third signal is representative of a luma signal corresponding to the selected channel; and
    chroma circuitry to generate a fourth signal using the baseband video signal, wherein the fourth signal is representative of a chroma signal corresponding to the selected channel;
  timing recovery circuitry, coupled to the tuner circuitry, to generate a timing signal using the timing information within the broadcast-frequency analog video signal; and
  format circuitry, coupled to the processing circuitry, to generate and output the formatted video signal, corresponding to the selected channel, using the third signal, the fourth signal and the timing signal.

15. The system of claim 14 wherein the filter circuitry includes a pass-band filter having a pass-band that corresponds to and changes in accordance with the selected channel.

16. The system of claim 15 wherein each channel of the plurality of channels of the broadcast spectrum includes a center frequency and wherein the pass-band of the pass-band filter includes a center frequency which correlates to the center frequency of the selected channel.

17. The system of claim 15 wherein the amplifier circuitry is tunable and wherein the gain of the amplifier is correlated with the pass-band of the filter circuitry.

18. The system of claim 11 wherein the video decoder circuitry is a portion of the integrated circuit.

19. The system of claim 18 wherein the video decoder circuitry includes:
  processing circuitry, coupled to the baseband demodulator circuitry, to process the baseband video signal, the processing circuitry including:
    luma circuitry to generate a third signal using the baseband video signal, wherein the third signal is representative of a luma signal corresponding to the selected channel; and
  timing recovery circuitry, coupled to the tuner circuitry, to generate a timing signal using the timing information within the broadcast-frequency analog video signal; and
  format circuitry, coupled to the processing circuitry, to generate and output the formatted video signal, corresponding to the selected channel, using the third signal and the timing signal.

20. The system of claim 19 wherein the filter circuitry includes a pass-band filter having a pass-band that corresponds to and changes in accordance with the selected channel.

21. The system of claim 20 wherein each channel of the plurality of channels of the broadcast spectrum includes a center frequency and wherein the pass-band of the pass-band filter includes a center frequency which correlates to the center frequency of the selected channel.

22. The system of claim 20 wherein the amplifier circuitry is tunable and wherein the gain of the amplifier is correlated with the pass-band of the filter circuitry.

23. The system of claim 11 wherein mixing circuitry includes:
  a first mixer to mix the amplified representation of at least the portion of the broadcast-frequency analog video signal with a first sinusoidal signal to generate the in-phase component, and
  a second mixer to mix the amplified representation of at least the portion of the broadcast-frequency analog video signal with a second sinusoidal signal to generate the quadrature component.

24. A system, coupled to a signal source that receives a broadcast spectrum from an electrically or optically conductive medium, to output video signals corresponding to a selected channel which is one of a plurality of channels of the broadcast spectrum, the system comprising:
  tuner circuitry, coupled to the signal source, to receive a broadcast-frequency analog video signal and to output a baseband video signal, which corresponds to the selected channel of the broadcast spectrum, the tuner circuitry including:
    amplifier circuitry, coupled to the signal source, to generate and output a first signal using at least a portion of the broadcast-frequency analog video signal, wherein the first signal is an amplified representation of at least the portion of the broadcast-frequency analog video signal;
    mixing circuitry, coupled to the amplifier circuitry, to receive the amplified representation of at least a portion of the broadcast-frequency analog video signal and to generate a second signal having an in-phase component and a quadrature component, wherein the mixing circuitry mixes the first signal with a complex sinusoidal signal having a frequency which is at least substantially equal to a frequency which is associated with the selected channel of the broadcast spectrum;
    cancellation circuitry, coupled to the mixing circuitry, to generate and output a cancellation signal which is associated with the selected channel, wherein the cancellation signal is a substantially time-invariant signal; and
    summing circuitry, coupled to the mixing circuitry and the cancellation circuitry, to generate a third signal which is a sum the second signal and the cancellation signal, wherein the third signal includes a reduced substantially time-invariant offset relative to the second signal; and baseband demodulator circuitry, coupled to the summing circuitry, to output a baseband video signal, which corresponds to the selected channel, using the third signal; and video decoder circuitry, coupled to the tuner circuitry, to receive the baseband video signal and output a formatted video signal corresponding to the selected channel of the broadcast spectrum, the video decoder circuit being configured to provide a timing signal to cancellation circuitry.

25. The system of claim 24 wherein the tuner further includes local oscillator circuitry, coupled to the mixing circuitry, to generate and output the complex sinusoidal signal.

26. The system of claim 24 wherein the video decoder circuitry further includes:

processing circuitry, coupled to the baseband demodulator circuitry, to process the baseband video signal, the processing circuitry including:

luma circuitry to generate a fourth signal using the baseband video signal, wherein the fourth signal is representative of a luma signal corresponding to the selected channel;

timing recovery circuitry, coupled to the tuner circuitry, to generate a timing signal using the timing information within the broadcast-frequency analog video signal; and format circuitry, coupled to the processing circuitry, to generate and output the formatted video signal, corresponding to the selected channel, using the fourth signal and the timing signal.

27. The system of claim 24 wherein the substantially time-invariant offset includes a direct-current (DC) voltage offset.

28. The system of claim 24 further including filter circuitry, coupled to the signal source, to receive a broadcast-frequency analog video signal and to generate a filtered representation of the broadcast-frequency analog video signal, wherein the filter circuitry includes a pass-band filter having a pass-band that corresponds to the selected channel of the broadcast spectrum, and wherein the amplifier circuitry generates and outputs the first signal using the filtered representation of the broadcast-frequency analog video signal.

29. The system of claim 28 wherein the amplifier circuitry is tunable and wherein the gain of the amplifier is correlated with the pass-band of the filter circuitry.

30. The system of claim 24 wherein the summing circuitry is a current mode summing circuit or a voltage mode summing circuit.

31. The system of claim 24 wherein the video decoder circuitry further includes:

processing circuitry, coupled to the baseband demodulator circuitry, to process the baseband video signal, the processing circuitry including:

luma circuitry to generate a third signal using the baseband video signal, wherein the fourth signal is representative of a luma signal corresponding to the selected channel; and chroma circuitry to generate a fourth signal using the baseband video signal, wherein the fifth signal is representative of a chroma signal corresponding to the selected channel;

timing recovery circuitry, coupled to the tuner circuitry, to generate a timing signal using the timing information within the broadcast-frequency analog video signal; and format circuitry, coupled to the processing circuitry, to generate and output the formatted video signal, corresponding to the selected channel, using the fourth signal, the fifth signal and the timing signal.

32. The system of claim 31 further including filter circuitry, coupled to the signal source, to receive a broadcast-frequency analog video signal and to generate a filtered representation of the broadcast-frequency analog video signal, wherein the filter circuitry includes a pass-band filter having a pass-band that corresponds to the selected channel of the broadcast spectrum, and wherein the amplifier circuitry generates and outputs the first signal using the filtered representation of the broadcast-frequency analog video signal.

33. The system of claim 32 wherein the amplifier circuitry is tunable and wherein the gain of the amplifier is correlated with the pass-band of the filter circuitry.

34. The system of claim 31 wherein the summing circuitry is a current mode summing circuit or a voltage mode summing circuit.

35. A system, coupled to a signal source that receives a broadcast spectrum from an electrically or optically conductive medium, to output video signals corresponding to a selected channel which is one of a plurality of channels of the broadcast spectrum, the system comprising:

means to receive a broadcast-frequency analog video signal and to output a baseband video signal, which corresponds to the selected channel of the broadcast spectrum, the means includes:

means for generating and outputting a first signal using at least a portion of the broadcast-frequency analog video signal, wherein the first signal is an amplified representation of at least the portion of the broadcast-frequency analog video signal;

mixing means for receiving the amplified representation of at least a portion of the broadcast-frequency analog video signal and to generate a second signal having an in-phase component and a quadrature component, wherein the mixing circuitry mixes the first signal with a complex sinusoidal signal having a frequency which is at least substantially equal to a frequency which is associated with the selected channel of the broadcast spectrum;

means for generating and outputting a cancellation signal which is associated with the selected channel, wherein the cancellation signal is a substantially time-invariant signal;

means for generating a third signal which is a sum the cancellation signal and the second signal, wherein the third signal includes a reduced substantially time-invariant offset relative to the second signal; and means for outputting a baseband video signal, which corresponds to the selected channel, using the third signal, means for providing a timing signal that is used to generate a cancellation signal.

36. The system of claim 35 further including means for receiving a broadcast-frequency analog video signal and for generating a filtered representation of the broadcast-frequency analog video signal, and wherein the means for generating and outputting a first signal generates and outputs the first signal using the filtered representation of the broadcast-frequency analog video signal.

* * * * *